(12) United States Patent
Naganawa et al.

(10) Patent No.: US 7,113,404 B2
(45) Date of Patent: Sep. 26, 2006

(54) LIQUID COOLING SYSTEM

(75) Inventors: Takashi Naganawa, Chiyoda (JP); Rintaro Minamitani, Tsukuba (JP); Shigeo Ohashi, Tsuchiura (JP); Yoshihiro Kondo, Tsuchiura (JP); Osamu Suzuki, Chiyoda (JP); Hitoshi Matsushima, Ryugasaki (JP)

(73) Assignee: Hitachi, Ltd., Tokyo (JP)

( * ) Notice: Subject to any disclaimer, the term of this patent is extended or adjusted under 35 U.S.C. 154(b) by 237 days.

(21) Appl. No.: 10/791,772

(22) Filed: Mar. 4, 2004

(65) Prior Publication Data

US 2005/0088820 A1    Apr. 28, 2005

(30) Foreign Application Priority Data

Oct. 27, 2003   (JP)   ............................ 2003-365411

(51) Int. Cl.
  *H05K 7/20*   (2006.01)
  *H05K 1/00*   (2006.01)
  *F28F 7/00*   (2006.01)
  *H01L 23/34*  (2006.01)

(52) U.S. Cl. ............... 361/699; 174/15.1; 174/252; 165/80.4; 257/714

(58) Field of Classification Search ............... 361/697, 361/699
See application file for complete search history.

(56) References Cited

U.S. PATENT DOCUMENTS

| | | | |
|---|---|---|---|
| 5,693,871 A * | 12/1997 | Stout et al. .................. 73/1.68 |
| 6,234,240 B1 | 5/2001 | Cheon | |
| 6,313,990 B1 * | 11/2001 | Cheon .......................... 361/699 |
| 2003/0030981 A1 | 2/2003 | Zuo et al. | |
| 2003/0151892 A1 | 8/2003 | Kondo et al. | |
| 2004/0008483 A1 * | 1/2004 | Cheon .......................... 361/687 |
| 2005/0178528 A1 * | 8/2005 | Ohashi et al. ............. 165/80.3 |
| 2005/0180105 A1 * | 8/2005 | Matsushima et al. ....... 361/699 |
| 2005/0180107 A1 * | 8/2005 | Naganawa et al. ......... 361/699 |

FOREIGN PATENT DOCUMENTS

| | | |
|---|---|---|
| EP | 1 160 649 | 12/2001 |
| JP | 2002-163042 | 6/2002 |

* cited by examiner

*Primary Examiner*—Lisa Lea-Edmonds
*Assistant Examiner*—Zachary Pape
(74) *Attorney, Agent, or Firm*—Antonelli, Terry, Stout and Kraus, LLP.

(57) ABSTRACT

A liquid cooling system, comprises: heat-receiving jacket 7, thermally connected with a heat-generation element, a pump attached onto a radiator 1a, and a tank portion 2 on the radiator 1a, wherein a coolant liquid is circulated between the heat-receiving jacket 7 and the radiator 1a by means of the pump 8, thereby obtaining the liquid cooling system for an electronic apparatus, being suitable for small-sizing and a thin-type, while maintaining high reliability thereof.

5 Claims, 7 Drawing Sheets

LIQUID COOLING SYSTEM

BACKGROUND OF THE INVENTION

The present invention relates to a liquid cooling system for cooling a semiconductor element with using a liquid as a medium for heat radiation.

In recent years, accompanying with an increase of demand on a high speed and a large capacity for an electronic apparatus, heat-generation of the semiconductor element also increases.

As a cooling means for dealing with such the high heat-generation, being disclosed, for example, in the patent document 1 listed up in the following, there is described an electronic apparatus, comprising: a main body housing for receiving therein a printed circuit board, on which a heat-generation element is mounted; and a display device housing, which has a display panel therewith and is also attached to the main body housing through a hinge, etc., rotatably.

Onto the heat-generation element is attached a heat-receiving jacket, and a liquid coming to be hot due to absorption of the heat through this heat-receiving jacket is circulated to a heat radiation pipe provided in the display devices housing, thereby radiating the heat therefrom. The liquid circulates with an aid of a liquid driving mechanism provided on the way of piping route or passages connecting between the heat-receiving jacket and the heat radiation pipe. Between each of those parts is conducted piping with an aid of connection of flexible tubers.

This conventional art is higher, in the cooling capacity thereof, than that obtained with a compulsive cooling only by means of fans, and is also superior in silencing characteristics, therefore it is effective for cooling of the electronic apparatus.

Patent Document 1: Japanese Patent Laying Open No. 2002-163042 (2002).

In the liquid cooling system described in the patent document 1 mentioned above, a pump is connected by means of a flexible tube (being described to be a silicon tube in the patent document 1). This is because, the heat radiation in the liquid cooling system is conducted on the display device housing of a notebook-type personal computer (hereinafter, being called by "note PC"), therefore the flexible tube is necessary for distributing the conduits for use of heat radiation, from a side of the main body housing to the display device housing thereof.

Also, this is because, since it is preferable to operate the pump under the condition of being disposed horizontally, in particular, for circulating the liquid with high efficiency therein, then it can be easily held in the horizontal direction if connecting the pump through the flexible tubes.

In this manner, the flexible tubes provided between the heat-receiving member and the pump are necessary, in particular, for use in a portion, having a movable part therein, however it brings about a large-sizing of the liquid cooling system for the existence of the flexible tubes, therefore there is a possibility of causing a trouble when applying the liquid cooling system into every kind of the electronic apparatuses.

BRIEF SUMMARY OF THE INVENTION

An object is, according to the present invention, to provide a liquid cooling system, which can be installed in any kind of the electronic apparatus, irrespective of the difference between the horizontal disposition and the vertical disposition.

For accomplishing such the object mentioned above, according to the present invention, first there is provided, a liquid cooling system, comprising: a heat-receiving jacket for absorbing heat of a heat-generation element through a liquid flowing with an inside thereof; a radiator for radiation heat from a surface thereof; and a pump for transporting said liquid absorbing the heat therein to said radiator, wherein said pump is connected to said radiator, directly.

Also, for accomplishing the object mentioned above, according to the present invention, liquid cooling system, comprising: a heat-receiving jacket for absorbing heat generated from a semiconductor through a liquid, which is enclosed within an inside thereof; a radiator being connected with said heat-receiving jacket through a flexible conduit therebetween; a tank being connected to said radiator through a conduit; and a pump for circulating said liquid, further comprising: a plural number of fins being attached onto a metal conduit of said radiator passing the liquid passes therethrough, wherein said pump is connected to said tank, which is connected to said metal conduit, directly.

Further, according to the preset invention, for accomplishing the object mentioned above, there is provided the liquid cooling system, as described in the above, wherein: said radiator has at least two (2) pieces of metal conduits, whereby forming a suction conduit of said pump from one of said metal conduits, while a discharge conduit to said heat-receiving jacket from the other of said conduits, and said suction/discharge conduits are communicated with an inside of said tank.

Further, also according to the preset invention, for accomplishing the object mentioned above, there is provided the wherein: a suction port and a discharge port are provided on said pump, and those ports are connected with said tank, being inserted into port insertion openings provided thereon.

And further, according to the preset invention, for accomplishing the object mentioned above, there is provided the wherein: an inside of said tank is divided into two (2) spaces with a partition plate, into one thereof being opened the suction port of said pump and said suction conduit while into the other thereof being opened said discharge port and said discharge conduit.

Furthermore, according to the preset invention, for accomplishing the object mentioned above, there is provided the wherein: a partition plate for separating an inside of said tank into two (2) is formed to be about "S" in shape thereof.

Moreover, according to the preset invention, for accomplishing the object mentioned above, there is provided the wherein: an air storage portion is provided in each of the spaces of said tank.

In addition to the above, according to the present invention, also for accomplishing the object mentioned above, there is further provided a liquid cooling system, comprising: a heat-receiving jacket for absorbing heat generated from a semiconductor element through a liquid enclosed in an inside thereof; a radiator being connected to said heat-receiving jacket through a conduit; a tank being connected to said radiator through a conduit; and a pump for circulating said liquid, wherein: a member building up said cooling system has a suction port and a discharge port, and is connected by inserting those ports into port insertion openings, which are provide in said conduits.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE INVENTION

As was mentioned in the above, the products are available on the market, such as, the note PC and the desktop PC, for example, in which cooling is achieved upon the heat-generating semiconductor element due to the liquid circulation therein, and further it is expected that the cooling method of using the liquid will be applied more widely, in the PCs.

However, this liquid cooling system should not be restricted the installation thereof only into the PCs, necessarily, but it may be applicable into all of the electronic apparatuses, installing in a part thereof an electronic part generating heat therefrom.

For example, a home server is already known, as AV equipment for substituting for the conventional type of the cassette video deck. This home sever attracts an attention, as the AV equipment in the future, enabling to take a large amount of distributed television programs at home, thereby to store (i.e., record) and/or reproduce only the programs to be reserved, waiting for a start of the digital terrestrial digital broadcasting.

On the other hand, there is a possibility that a plasma display will spread further widely, as such the AV equipment corresponding to this home server.

With those electronic apparatuses, since they are ones installed in a living room, in particular, in a house, therefore it is not suitable for them to have a fan installed therein, which generates a rotating sound from it, and then of course, attention is paid on the installation of the liquid cooling system therein in the place thereof.

In this manner, development is strongly demanded upon the liquid cooling system, which can be installed easily into the electronic equipments, such as, the home server and the plasma display, etc., being listed up as an example thereof.

According to the present invention, as a result of making various studies thereupon for responding to such the demands, the following embodiment are obtained:

EMBODIMENT 1

Figure 1:
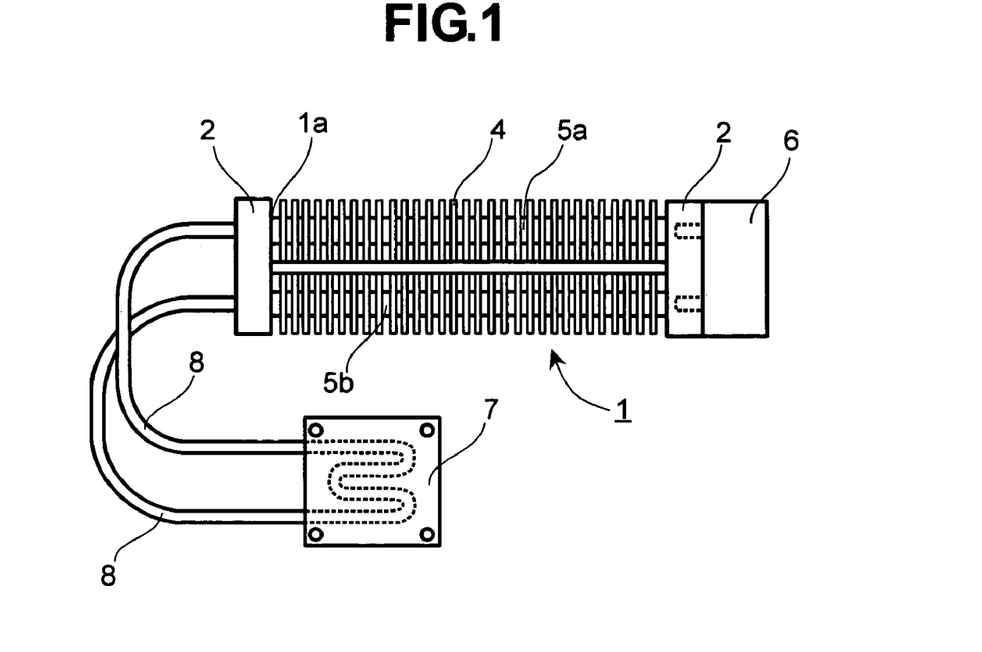
FIG. 1 is an upper view of a liquid cooling system having a radiator therein, according to a embodiment of the present invention.

FIG. 1 is an upper view for showing the liquid cooling system, including a radiator therein, according to the present embodiment.

In this FIG. 1, the liquid cooling system 1 is connected with a radiator 1a and a heat-receiving jacket 7 through tubes 8. This tube 8 is so-called a flexible tube (i.e., a flexible conduit, and in the present embodiment, butyl rubber is applied as the material thereof). To the radiator 1a is connected a pump 6, directly. This radiator 1a is built up with a discharge conduit 5a and a suction conduit 5b attached with fins 4 and a tank 2 thereon. The tank 2 is attached to both end portions of the discharge/suction conduits 5a and 5b, thereby forming a storage portion of the liquid supplied from the pump.

This liquid cooling system 1 is filled up with a coolant liquid (for example, water, anti-freezing liquid, etc.), and the coolant liquid circulates among the pump, the radiator 1a and the heat-receiving jacket 7, with an aid of driving with the pump 6.

Figure 2:
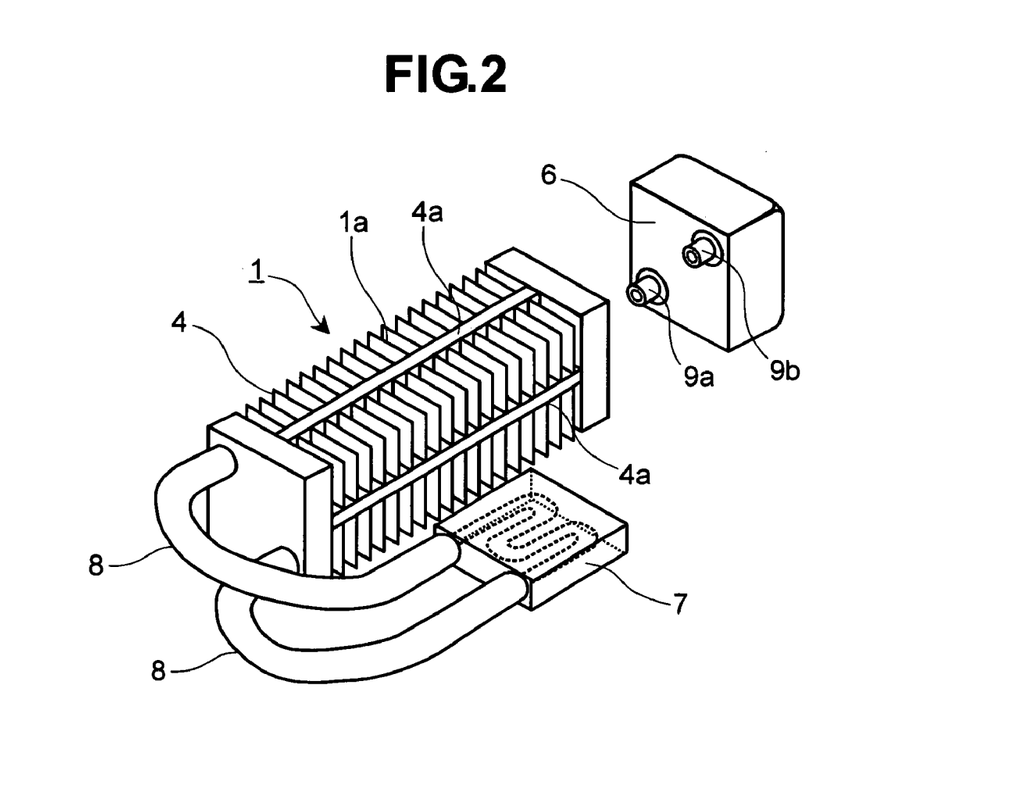
FIG. 2 is a perspective view of the liquid cooling system having the radiator therein, according the present embodiment.

FIG. 2 is a perspective view of the liquid cooling system including the radiator therein, according to the present embodiment (under the condition that the pump is removed from the radiator).

In this FIG. 2, as was mentioned in the above, the discharge/suction conduits 5a and 5b and the fins 4, building up the radiator portion 1a therewith, and also the tank 2 are fixed by means of a frame 4a. On the pump 6 are provided discharge/suction ports 9a and 9b, and the port 9b is inserted into a suction side of the tank 2, while the port 9a is inserted into the discharge side of the tank 2, respectively (in this aspect, explanation will be given in more details thereof, by referring to FIG. 3)

Figure 3:
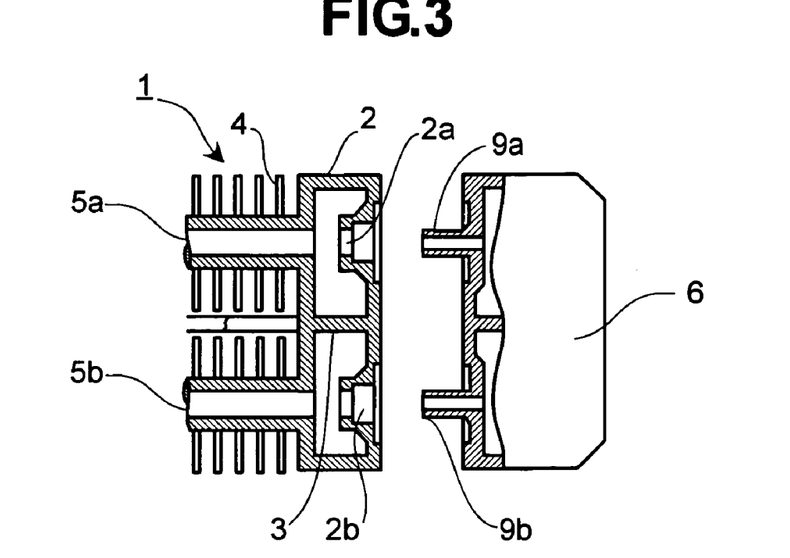
FIG. 3 is a partial cross-section view for showing the condition before attaching a pump onto the radiator.
Figure 4:
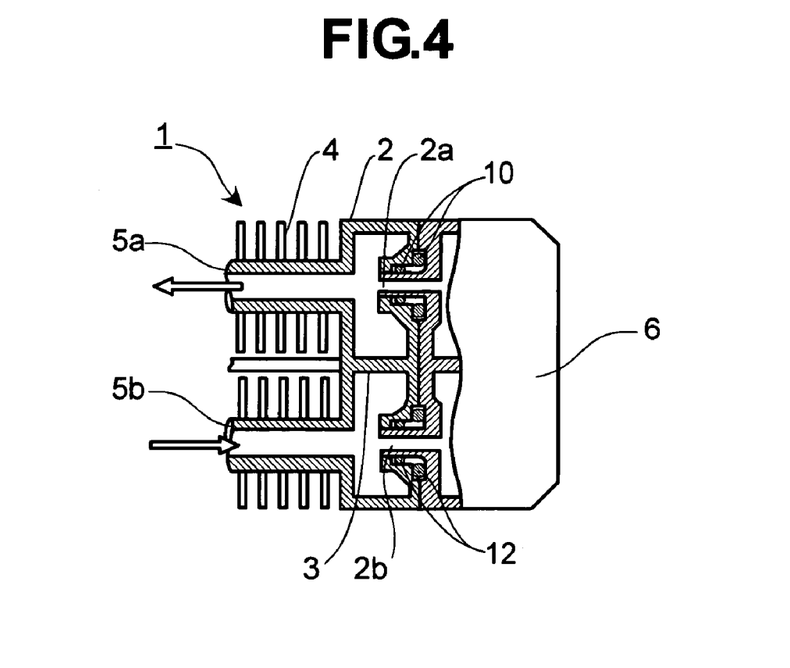
FIG. 4 is a partial cross-section view for showing the condition when attaching the pump onto the radiator.

FIGS. 3 and 4 are views for explaining the structure of attaching the radiator and the pump within the liquid cooling system, according to the present embodiment.

Those FIGS. 3 and 4 are partial cross-section views of the radiator and the pump, wherein FIG. 3 shows the condition before the pump 6 is attached onto the radiator 1a, and FIG. 4 the condition after attaching thereof.

In FIG. 3, on the tank 2 are provided port insertion openings 2a and 2b at the positions, opposing to the discharge port 9a and the suction port 9b, which are provided on the pump 6. This tank 2 is divided into two (2) chambers in the space therein, by a partition plate 3, and those spaces are connected to a discharge/suction conduits 5a and 5b, respectively, which are provided within the radiator 1a opposing to them respectively.

In FIG. 4, when the discharge port 9a and the suction port 9b are inserted into the two (2) port insertion openings 2a and 2b, respectively, with an aid of "O" rings 10 attached to the insertion portions, and then the coolant liquid is hermetically sealed up.

Thus, it is of the structure, so that the coolant liquid flows in the direction indicated by arrows shown in the figure, when driving the pump 6.

Figure 5A:
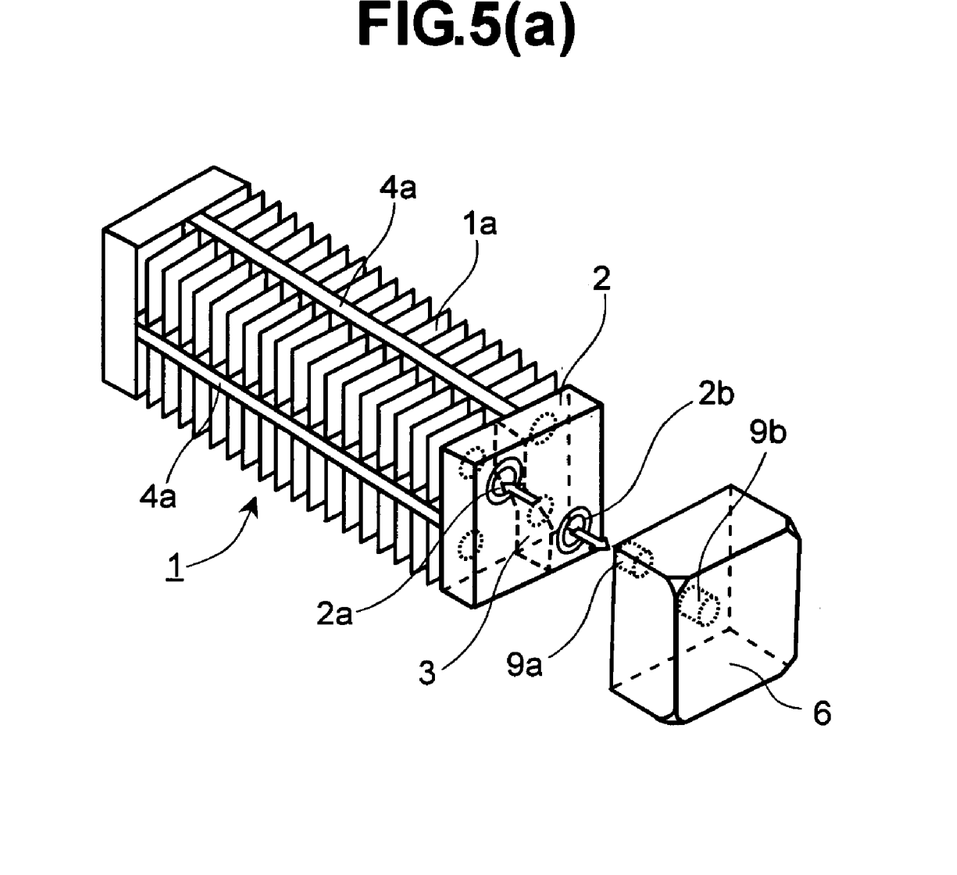
FIGS. 5(a) and 5(b) are a perspective view of the liquid cooling system, according the present embodiment, being installed in the horizontal direction, and a cross-section view thereof.
Figure 6A:
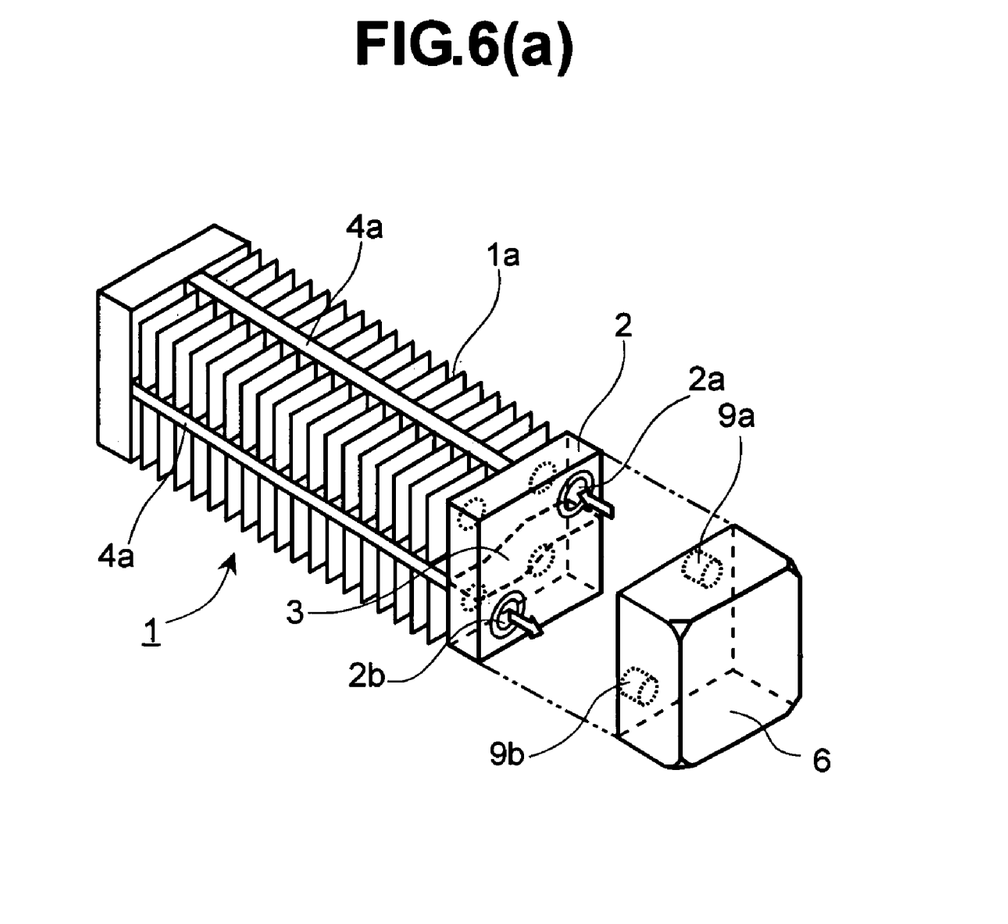
FIGS. 6(a) and 6(b) are a perspective view of the liquid cooling system, according the present embodiment, being installed in the vertical direction, and a cross-section view thereof.

FIGS. 5(a) and 6(a) are perspective views for explaining the directions of the radiator, according to the present embodiment, when it is disposed, as well as, the positions of suction and discharge of the pump.

However, for the purpose of the explanation thereof, the pump 6 and the radiator 1a are shown under the condition of being separated from each other, and between the pump 6 and the radiator 1a, the direction of flow of the coolant liquid is indicated by arrows shown therein. Herein, it is assumed that the condition of arrangement shown in FIGS. 5(a) and 5(b) is "horizontal disposition", while that shown in FIGS. 6(a) and 6(b) "vertical disposition", for example.

Figure 5B:
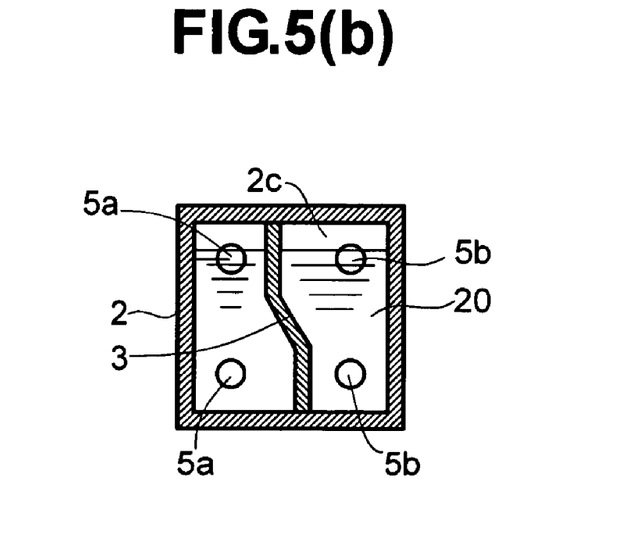

FIG. 5(a) is a perspective view for showing the structure of combining the radiator and the pump, and FIG. 5(b) is a cross-section view for explaining an inside of the tank.

In this FIG. 5(a), the pump 6 is disposed, so that the discharge portion 9a thereof comes up to the upper side, while the suction port 9b down to the lower side thereof. Within an inside of the tank 2 attached onto the radiator 1a, the partition plate 3 is provided at around the central portion thereof, thereby dividing the space to define two (2) chambers on both sides thereof. One chamber is of the discharge side, while the other chamber is of the suction side. The port insertion opening 2a of the radiator 1a opposing to the discharge port 9a within an inside of the tank 2 is located at the upper side, while the port insertion opening 2b is located at the lower side thereof. The partition plate 3 is formed to be about "S"-like in the shape thereof (however, the effect of making this into the "S" shape will be explained by referring to the embodiment shown in FIGS. 6(a) and 6(b)).

In FIG. 5(b), an amount of an open or outside air comes into an inside of the conduit, corresponding to an amount of the liquid leaking out, through penetration of water through the flexible tube 8 itself, which is connected between the radiator 1a and the heat-receiving jacket 7, and it is mixed up with therein. And, in the case when the pump 6 sucks this air therein, a force for pushing out the liquid comes down, extremely. For this reason, according to the present embodiment, a space is defined within the tank, for the purpose of accumulating the air mixing within the conduit. This space is the space 2c shown in FIG. 5(b).

In the present embodiment, the radiator is built up with the two (2) pieces of discharge conduits 5a and the two (2) pieces of suction conduits 5b; i.e., four (4) pieces of conduits, in total. The discharge conduits 5a are opened into the space at the side of the port insertion opening 2a, which are separated by means of the partition plate 3, while the suction conduits 5b are opened into the space at the side of the port insertion opening 2b. As is shown in FIG. 5(b), although a part of the one of the suction conduits 5b is exposed to the air, however the other suction conduit 5b lies within the liquid, therefore the pump 6 will not suck the air therein.

FIG. 6(a) is a perspective view for showing the structure combining the radiator and the pump, and it corresponds to the condition where the radiator shown in FIG. 5(a) mentioned above is rotated around by 90 degree, and FIG. 6(b) is a cross-section view for explaining the inside of the tank.

In FIG. 6(a), according to the present embodiment differing from that shown in FIG. 5(a) mentioned above, the discharge port 9a of the pump 6 is located at the upper side, while the suction port 9b thereof at the lower side thereof. Though the partition plate 3 provided within the tank 2 is directed horizontally, however as is shown by a dotted line in the figure, the cross-section area on the upper side and the lower side are narrowed at the side of the port insertion opening 2b, while it is widen at the side of the port insertion opening 2a. This is a result of making the partition plate 3 in the "S"-like shape, wherein this upper space performs an accumulation portion of air when the air comes into from a side of the port insertion opening 2a.

With this, even though assuming that the pump 6 sucks the air therein, and the sucked air mixing into the liquid within the conduits for circulation and suction thereof, however since the air is accumulated in the upper side having the wide cross-section area, because of the function of the partition plate 3 which is provided within the tank 2, therefore the air never mixing into the port insertion opening 11b, therefore only the coolant liquid is circulated around. However, this is only true under the condition that the port insertion openings always lay within the liquid.

Figure 6B:
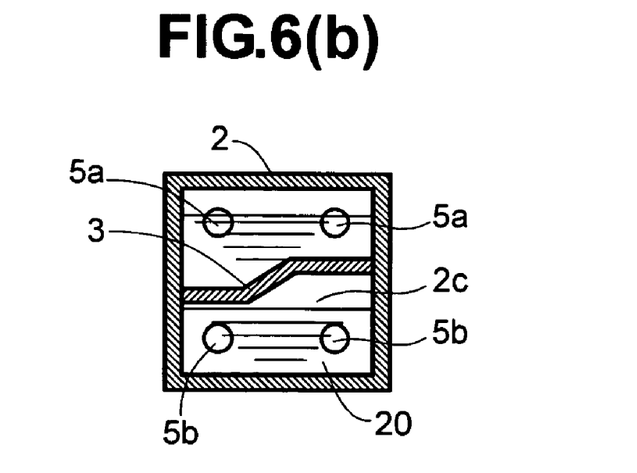

In FIG. 6(b), for defining the space by the partition plate 3, so as to accumulate therein the air that is mixed within the conduits, it is formed to be "S"-like in the shape thereof. That space is the space 2c shown in FIG. 5(b).

In the present embodiment, the radiator is built up with the two (2) pieces of discharge conduits 5a and the two (2) pieces of suction conduits 5b; i.e., four (4) pieces of conduits in total. The discharge conduits 5a are opened into the space at the side of the port insertion opening 2a, which is partitioned by means of the partition plate 3, while the suction conduits 5b are opened into the space on the side of the port insertion opening 2b. As is shown in FIG. 5(b) mentioned above, the two (2) pieces of suction conduits 5b lie within the liquid, therefore the pump 6 will not suck the air therein. However, as was mentioned above, it is only true under the condition that the port insertion openings always lay within the liquid.

Figure 7:
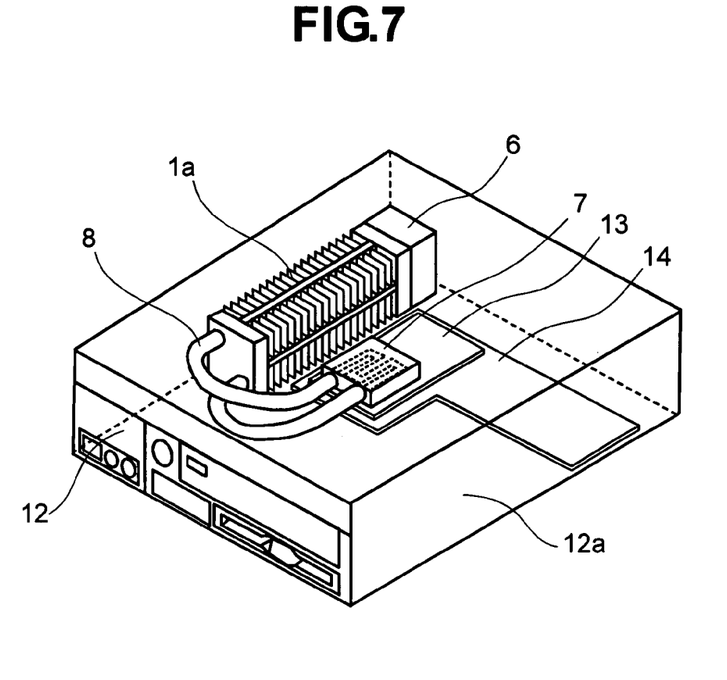
FIG. 7 is a perspective view of an electronic apparatus having the liquid cooling system therein, according the present embodiment, being installed in the horizontal direction.
Figure 8:
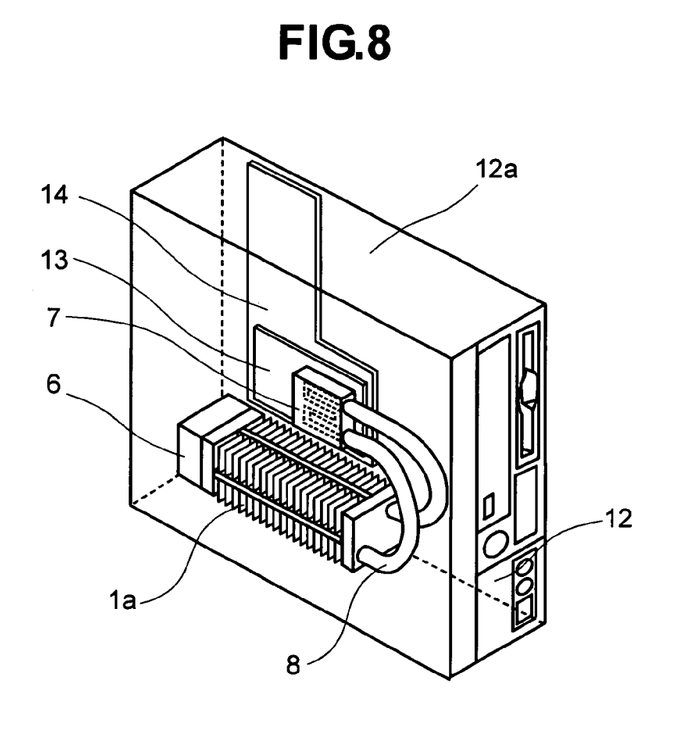
FIG. 8 is a perspective view of an electronic apparatus having the liquid cooling system therein, according the present embodiment, being installed in the vertical direction.

FIGS. 7 and 8 explain the condition where the cooling system is installed, which includes the radiator 1a, and so on, according to the present embodiment, in particular, within the housing of the electronic apparatus.

However, for the purpose of explanation thereof, the housing 12a is indicated to be transparent one in the figure, though corresponding to an outer surface of the electronic apparatus.

FIG. 7 is a perspective view of the electronic apparatus lying in the horizontal direction.

FIG. 8 is a perspective view of the electronic apparatus lying in the vertical direction.

In those FIGS. 7 and 8, within an inside of the housing 12a of the electronic apparatus 12, there are installed a main printed circuit board 14, etc., on which a plural number of elements are mounted. On the main printed circuit board 14 is mounted a CPU board 13, etc., on which an element, in particular, that having a large amount of heat-generation is mounted; such as, the CPU (i.e., the central processing unit), etc., for example.

Upon the CPU (though not shown in the figure) is attached the heat-receiving jacket 7, and the CPU and the heat-receiving jacket 7 are connected through a soft heat-conductive material (for example, a silicon rubber mixing therein a heat conductive filler, such as, aluminum oxide, etc. But, not shown in the figure).

The radiator 1a, which is attached with the pump 6 thereon, and the heat-receiving jacket 7 are connected with each other through the tubes 8, thereby building up a closed circulation circuit for the coolant liquid. When the pump 6 starts the operation thereof, the coolant liquid enclosed therein circulates around, such as, in the order: the pump 6→the radiator 1a→the heat-receiving jacket 7→the radiator 1a →the pump 6.

The heat generated in the CPU is transmitted to the coolant liquid flowing within the heat-receiving jacket 7, and during when passing through the radiator 1a, it is radiated into an outside air on a surface of the radiator 1a.

The coolant liquid, lowering down the temperature thereof with this, is then sent out to the heat-receiving jacket 7, again.

The suction conduits (not shown in the figure) of the radiator 1a, according to the present embodiment, as well as, the tank portion 2 and the heat-receiving jacket 7 are made of copper alloy, which has good thermal conductivity thereof, and an outer case of the pump 6 is made of a resin (such as, PPS: polyphenylene sulfide resin+glass fiber 40%), which can be easily formed into a complex shape and has a superior mechanical strength thereof. And, each of the tubes connecting those parts is made of butyl rubber, being superior in the heat resistance and anti-permeability thereof.

However, the reason of building up the case of the pump 6 made of the resin lies in that because it is light and the forming thereof is relatively easy.

Further, although the case of the pump 6 was explained, being made of the resin with using the PPC as a basic resin thereof, in the present embodiment mentioned above, however other resin also may be applicable therein, which is superior in the heat resistance and anti-permeability thereof. Further, it is also possible to build up the case of the pump 6 itself with using a metal, so as to prevent the coolant liquid from penetrating or leaking therethrough.

As was mentioned in the above, with such the structure of the connection between the heat-receiving jacket 7, which is connected to the heat-generation element, and the radiator 1a, which is attached with a pump 6 thereon through the tubes 8, it is possible to reduce the number of parts in the tube connection portion, and thereby improving the reliability thereof against the liquid leakage.

EMBODIMENT 2

Figure 9:
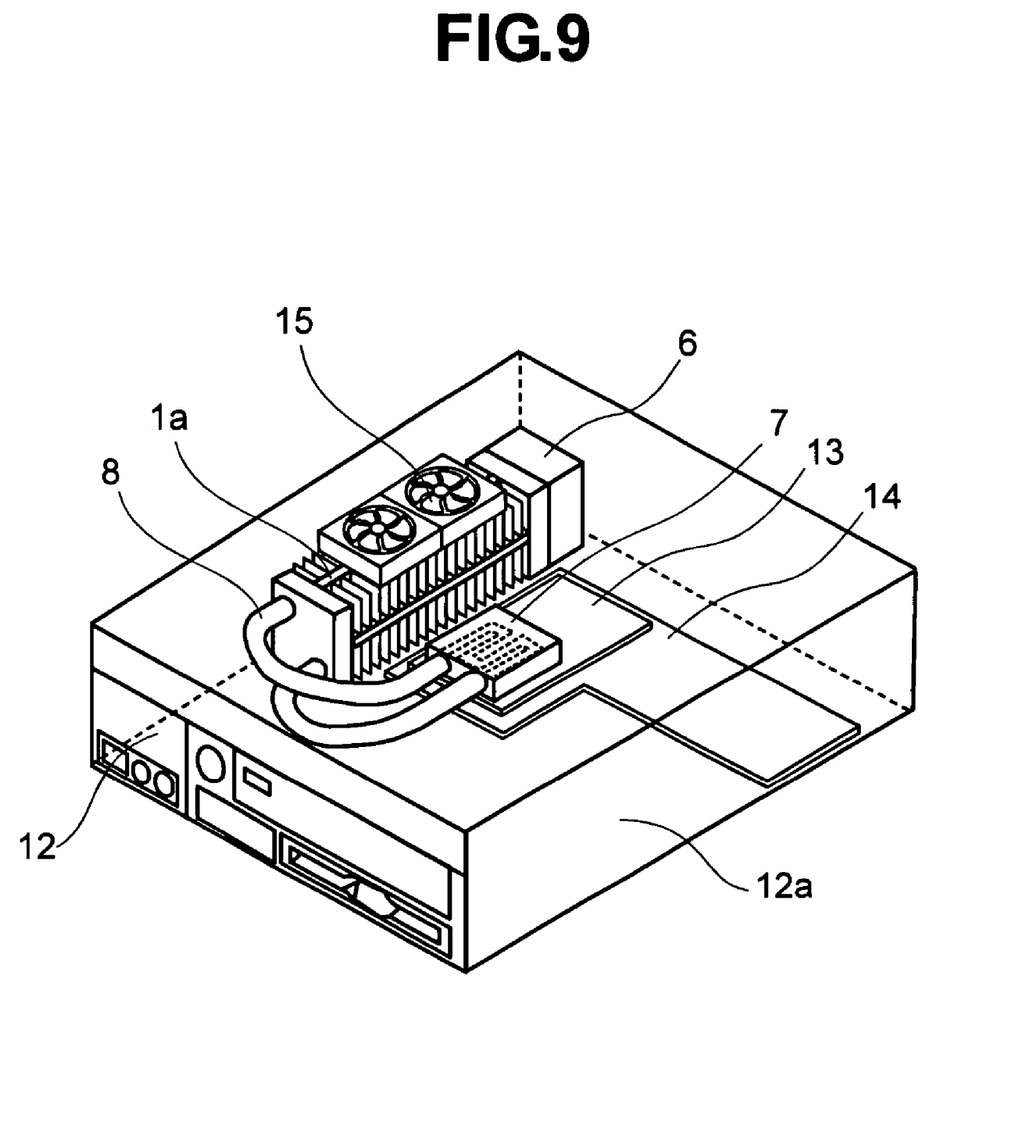
FIG. 9 is a perspective view of the electronic apparatus having the liquid cooling system, according to a second embodiment of the present invention.

FIG. 9 is a perspective view of the electronic apparatus, being further provided a fan within the cooling system of the embodiment 1 mentioned above.

In this FIG. 9, the mechanism of the coolant liquid is same to that of the embodiment 1 mentioned above, and the fan 15 is provided on the radiator 1a. Operation of the fan 15 during when the coolant liquid circulates can discharge the heat around the radiator 1a into an outside of the housing 12a, compulsively, thereby improving the cooling efficiency of the radiator 1a.

EMBODIMENT 3

Figure 10A:
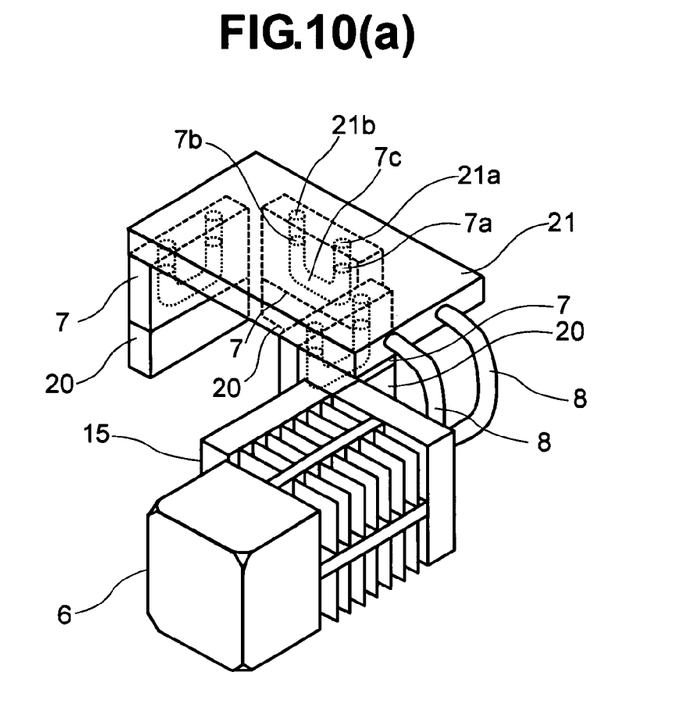
FIGS. 10(a) and 10(b) are a perspective view and a plan view of a radiator for cooling a plural number of heat-generation elements, according to the present embodiment mentioned above.
Figure 10B:
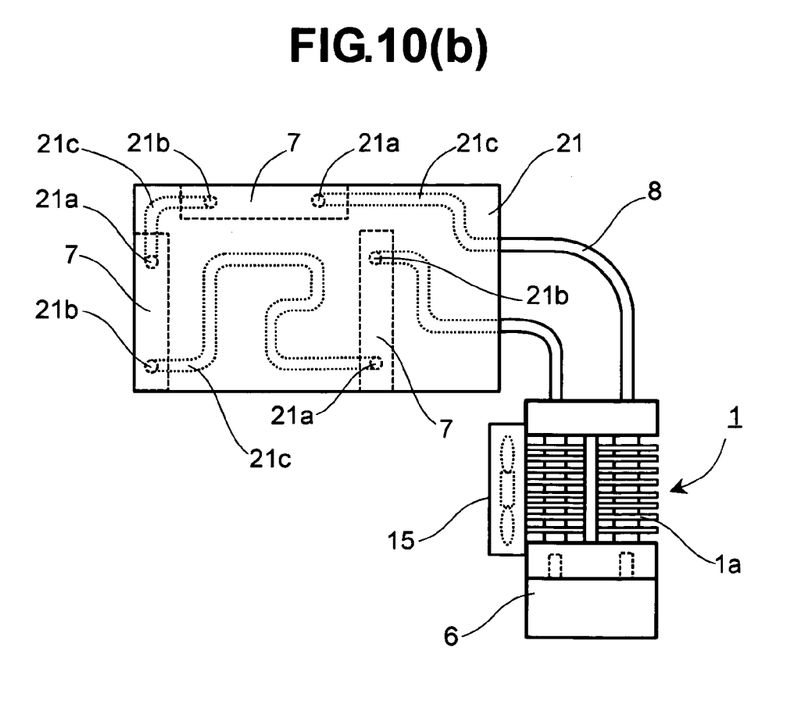

FIGS. 10(a) and 10(b) are views of the liquid cooling system 1, in particular, for cooling down a plural number of the heat-generation elements; including a radiator 1a, according to the present embodiment, wherein FIG. 10(a) is a perspective view thereof, and FIG. 10(b) a plan view thereof.

Three (3) heat-generation elements 20 are disposed at the positions in three (3) directions, respectively, and to each of those heat-generation elements 20 is connected a heat-receiving jacket 7, on which port insertion openings 7a and 7b are opened. Between the port insertion openings 7a and 7b are communicated with a flow passage 7c within the jacket 7. To a common header 21 are attached ports 21a and 21b, and those ports 21a and 21b are formed at the positions to be connected with the port insertion openings of the three (3) pieces of the heat-generation elements 20. Also, between the ports provided on the common header 21 are communicated with through a flow passage 21c. The radiator 1a being attached with the pump 6 thereon and the radiator 1a are connected to the common header 21 through tubes 8, and also the common head 21 and the three (3) pieces of the heat-receiving jackets 7 are connected with, inserting the ports 21a and 21b of the common header 21 into the port insertion openings 7a and 7b, in each of the heat-receiving jackets, thereby building up a closed circulation route or circuit. Thus, when the pump 6 starts the operation thereof, the coolant liquid enclosed therein circulates around, for example, through the following routes:

The pump 6→the radiator 1a→the common header 21→the heat-receiving jacket 7 ($1^{st}$ one)→the common header 21→the heat-receiving jacket 7 ($2^{nd}$ one)→the common header 21→the heat-receiving jacket 7 ($3^{rd}$ one)→the common header 21→the radiator 1a→the pump 6.

The heat of the heat-generation element 20 is transmitted to the coolant liquid flowing within the heat-receiving jacket, and it is radiated into an outside air from a surface of the radiator 1a, during when passing through the radiator following after the common header 21. The coolant liquid, lowering down the temperature thereof with this, passes through the common header 21, again, thereby to be sent out to the heat-receiving jacket 7. Further, driving of the fan 15, in particular during when the coolant liquid is circulated around, can discharge the heat around the radiator 1a into an outside, compulsively, thereby improving up the cooling efficiency of the radiator 1a.

Also, in the present embodiment, the pump 6 and the radiator can be attached with each other, in a detachable manner, and at the same time, they can be attached with the common header 21, also in the detachable manner.

Though the present embodiment shows only a case of being applied into the personal computer in the above, for example, however it can be also applicable into, not only the personal computer, but also other electronic apparatuses, in which the plural number of heat-generation elements are mounted in neighbor thereof to each other. And, it may be applicable into the structure of forming the flow passages in the heat-generation member, wherein they are communicated with the common header, directly.

Also, with the structure of the heat-receiving jacket being detachable, as the embodiment 3 shown in FIGS. 10(a) and 10(b) mentioned above, it is possible to cool down each of the heat-generation elements even if being mounted in a plural number thereof.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A liquid cooling system, comprising:
    a heat-receiving jacket for absorbing heat generated from a semiconductor through a liquid, which is enclosed within an inside thereof;
    a pump for circulating the liquid;
    a radiator connected to said heat-receiving jacket through a flexible conduit therebetween;
    said radiator including at least two (2) metal conduits for passing the liquid therethrough, one of said at least two metal conduits forming a suction conduit of said pump, and a second of said at least two metal conduits forming a discharge conduit to said heat-receiving jacket;
    a tank connected to said radiator through a direct connection to said at least two metal conduits; and a plural number of fins attached to said at least two metal conduits, wherein said suction conduit and said discharge conduit are in communication with an inside of said tank, and wherein said pump is connected to said tank.

2. The liquid cooling system, as described in the claim 1, wherein:

a suction port and a discharge port are provided on said pump, and those ports are connected with said tank, being inserted into port insertion openings provided thereon.

3. The liquid cooling system, as described in the claim 1, wherein:

an inside of said tank is divided into two (2) spaces with a partition plate, into one thereof being opened a suction port of said pump and said suction conduit while into the other thereof being opened a discharge port and said discharge conduit.

4. The liquid cooling system, as described in the claim 1, wherein:

a partition plate for separating an inside of said tank into two (2) is formed to be "S" in shape.

5. The liquid cooling system, as described in the claim 3, wherein:

an air storage portion is provided in each of the spaces of said tank.

\* \* \* \* \*